United States Patent
Liou et al.

(10) Patent No.: US 10,431,457 B2
(45) Date of Patent: Oct. 1, 2019

(54) METHOD FOR FORMING PATTERNED STRUCTURE

(71) Applicant: UNITED MICROELECTRONICS CORP., Hsin-Chu (TW)

(72) Inventors: En-Chiuan Liou, Tainan (TW); Yu-Cheng Tung, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 364 days.

(21) Appl. No.: 15/361,085

(22) Filed: Nov. 25, 2016

(65) Prior Publication Data

US 2018/0149978 A1     May 31, 2018

(51) Int. Cl.
*G03F 1/70* (2012.01)
*H01L 21/027* (2006.01)
*G03F 7/00* (2006.01)
*G03F 7/20* (2006.01)

(52) U.S. Cl.
CPC ........ *H01L 21/0274* (2013.01); *G03F 7/0035* (2013.01); *G03F 7/203* (2013.01)

(58) Field of Classification Search
CPC ..... G03F 1/70; G03F 2/2022; H01L 21/0274; H01L 21/3081; H01L 21/3086
USPC ........................................................ 430/323
See application file for complete search history.

(56) References Cited

U.S. PATENT DOCUMENTS

| | | | |
|---|---|---|---|
| 7,241,558 B2 * | 7/2007 | Huang | G03F 1/36 |
| | | | 430/311 |
| 7,709,396 B2 | 5/2010 | Bencher | |
| 7,732,343 B2 | 6/2010 | Niroomand | |
| 7,856,613 B1 | 12/2010 | Weling | |
| 9,268,210 B2 | 2/2016 | Hung | |
| 2017/0017745 A1 * | 1/2017 | Wang | G06F 17/5068 |

* cited by examiner

*Primary Examiner* — Daborah Chacko-Davis
(74) *Attorney, Agent, or Firm* — Winston Hsu

(57) ABSTRACT

A method for forming a patterned structure includes following steps. First lines elongated in a first direction and second lines elongated in a second direction in a layout pattern are decomposed into two masks. A first mask includes first line patterns and a first block pattern. A second mask includes second line patterns and a second block pattern. Two photolithography processes with the first mask and the second mask are performed for forming a patterned structure including first line structures and second line structures. Each first line structure is elongated in the first direction. The first line structures are defined by a region where the first line patterns and the second block pattern overlap with one another. Each second line structure is elongated in the second direction. The second line structures are defined by a region where the second line patterns and the first block pattern overlap with one another.

13 Claims, 16 Drawing Sheets

METHOD FOR FORMING PATTERNED STRUCTURE

BACKGROUND OF THE INVENTION

1. Field of the Invention

The present invention relates to a method for forming a patterned structure, and more particularly, to a method for forming a patterned structure including line structures elongated in different directions.

2. Description of the Prior Art

In semiconductor manufacturing processes, in order to transfer an integrated circuit onto a semiconductor wafer, the integrated circuits from a database are first designed as a layout pattern and a photomask is then manufactured according to the layout pattern. Patterns on the photomask may then be able to be transferred to the semiconductor wafer. The steps mentioned above may be regarded as a photolithographic process. The layout pattern has to be extremely accurate for forming delicate integrated circuits so as to align with the patterns of the previous and following steps.

However, in the photolithographic process, deviations often occur when the patterns on the photomask are transferred onto the wafer surface and jeopardize the performance of the semiconductor device. Such deviations are usually related with the characters of the patterns to be transferred, the topology of the wafer, the source of the light and various process parameters, such as exposure and etching conditions. The manufactured patterns may not be exactly identical to the layout design, and the integrated circuit design will be limited accordingly.

SUMMARY OF THE INVENTION

It is one of the objectives of the present invention to provide a method for forming a patterned structure. Lines elongated in different directions in a layout pattern are decomposed into two masks. Two photolithography processes with these two masks respectively are performed for forming a patterned structure including line structures elongated in different directions. The similarity between the layout pattern and the patterned structure may be improved accordingly.

A method for forming a patterned structure is provided in an embodiment of the present invention. The method includes the following steps. A layout pattern is provided. The layout pattern includes a plurality of first lines and a plurality of second lines. Each of the first lines is elongated in a first direction, and each of the second lines is elongate in a second direction. The layout pattern is decomposed for forming a first mask and a second mask. The first mask includes a plurality of first line patterns corresponding to the first lines and a first block pattern corresponding to the second lines. The second mask includes a plurality of second line patterns corresponding to the second lines and a second block pattern corresponding to the first lines. A first photolithography process with the first mask and a second photolithography process with the second mask are performed for forming a patterned structure. The patterned structure includes a plurality of first line structures and a plurality of second line structures. Each of the first line structures is elongated in the first direction, and the first line structures are defined by a region where the first line patterns and the second block pattern overlap with one another. Each of the second line structures is elongated in the second direction, and the second line structures are defined by a region where the second line patterns and the first block pattern overlap with one another.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 6-12 are schematic drawings illustrating the method for forming the patterned structure according to the first embodiment of the present invention, wherein FIG. 7 is a cross-sectional diagram taken along a line A-A' in FIG. 6, FIG. 8 is a schematic drawing in a step subsequent to FIG. 6, FIG. 9 is a cross-sectional diagram taken along a line B-B' in FIG. 8, FIG. 10 is a schematic drawing in a step subsequent to FIG. 8, FIG. 11 is a cross-sectional diagram taken along a line C-C' in FIG. 10, FIG. 12 is a schematic drawing in a step subsequent to FIG. 10.

FIGS. 14-16 are schematic drawings illustrating the method for forming the patterned structure according to the second embodiment of the present invention, wherein FIG. 15 is a schematic drawing in a step subsequent to FIG. 14, and FIG. 16 is a schematic drawing in a step subsequent to FIG. 15.

DETAILED DESCRIPTION

Figure 1:
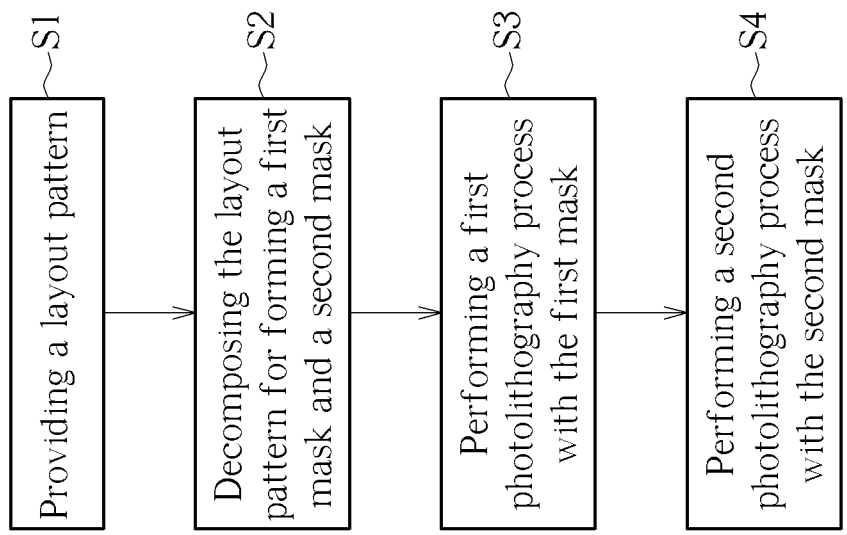
FIG. 1 is a flow chart of a method for forming a patterned structure according to a first embodiment of the present invention.
Figure 2:
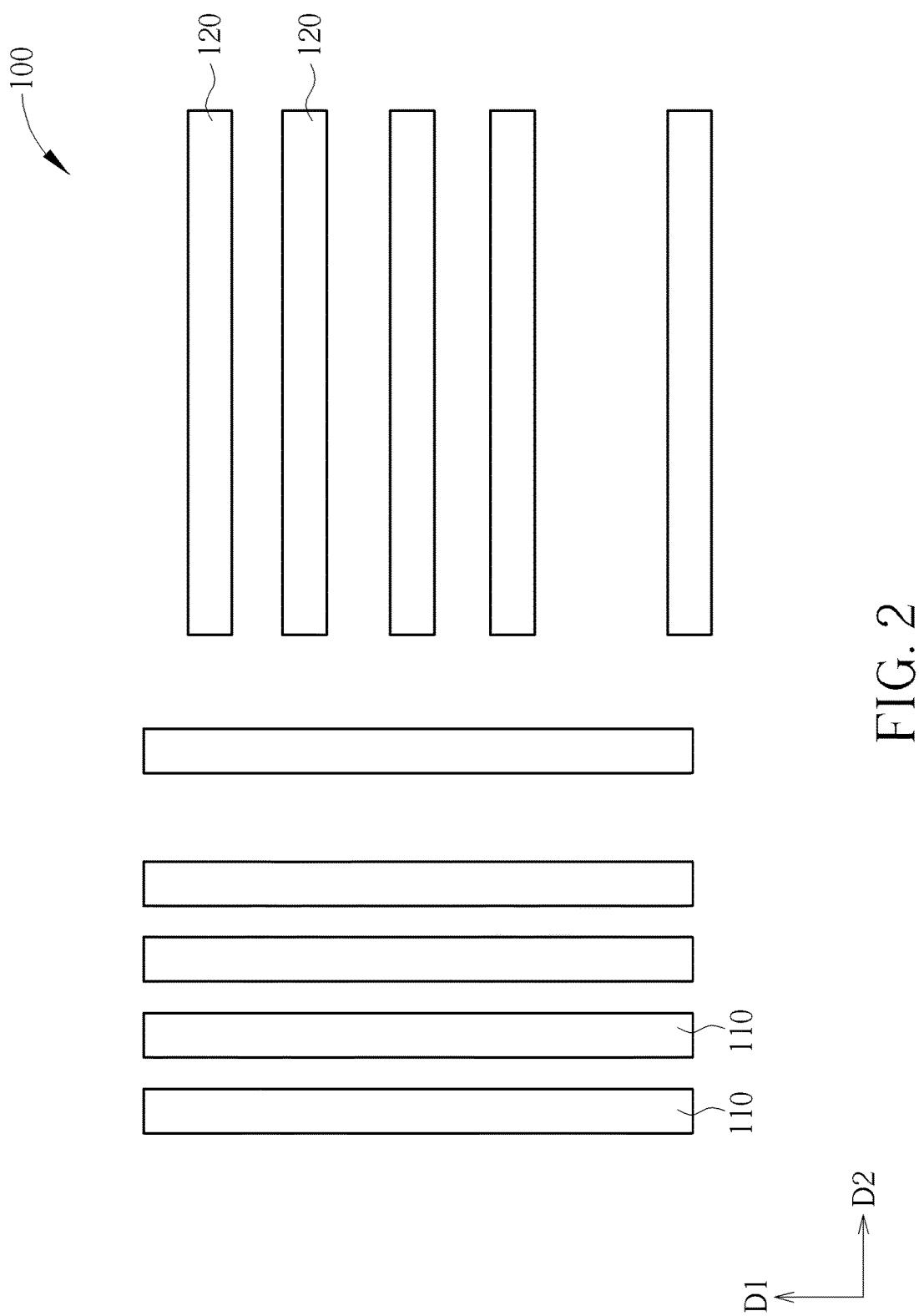
FIG. 2 is a schematic drawing illustrating a layout pattern in the method for forming the patterned structure according to the first embodiment of the present invention.
Figure 3:
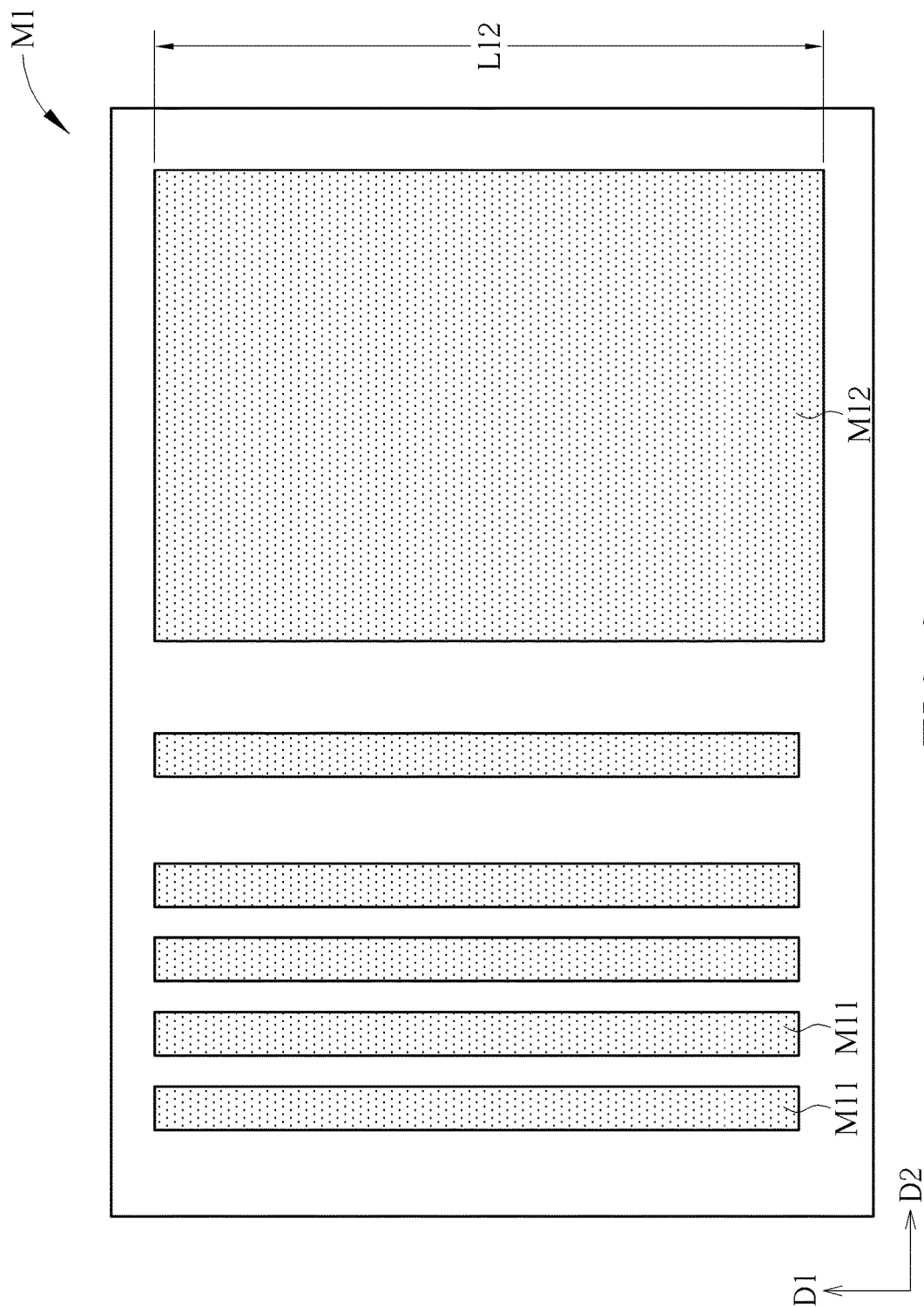
FIG. 3 is a schematic drawing illustrating a first mask in the method for forming the patterned structure according to the first embodiment of the present invention.
Figure 4:
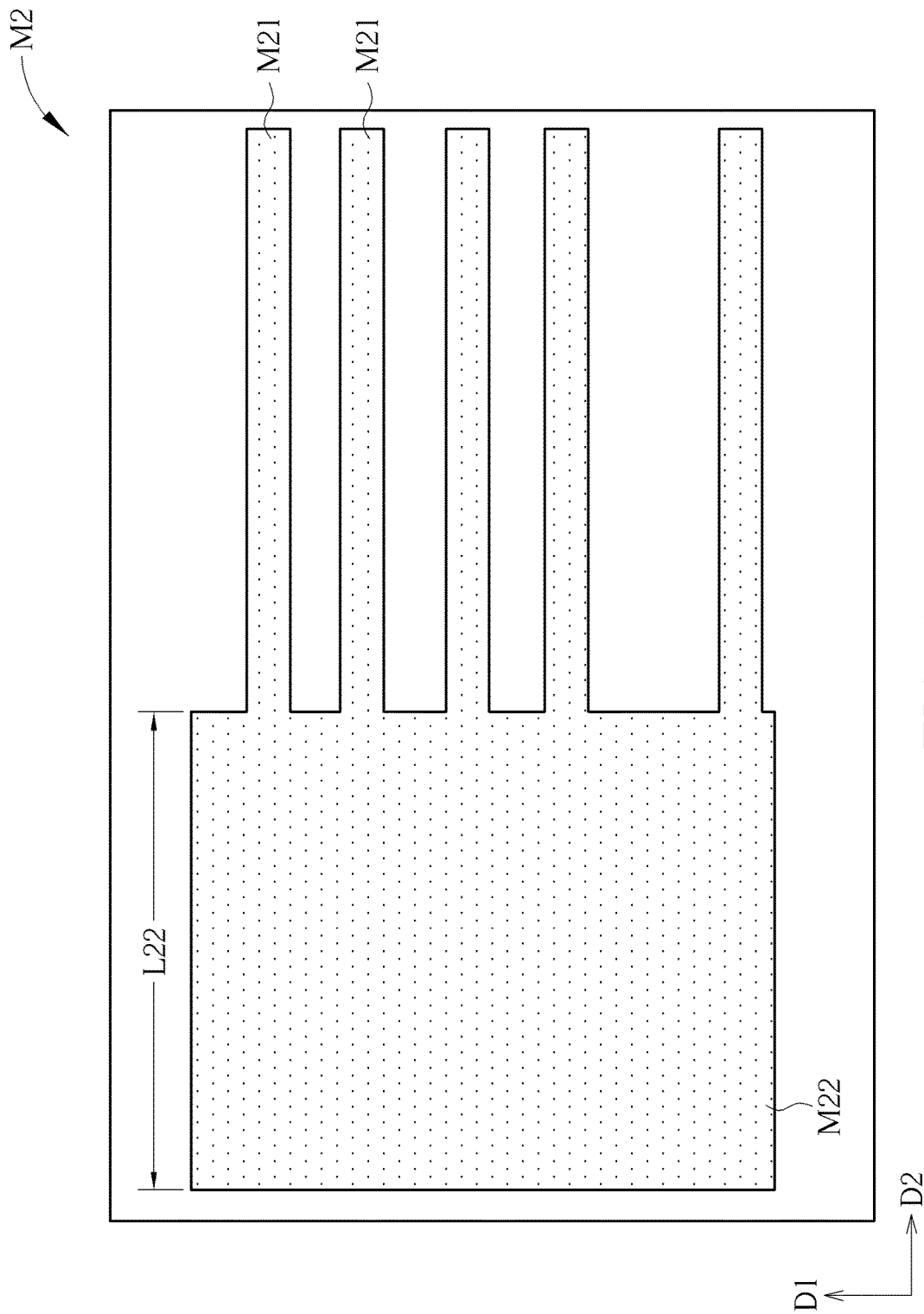
FIG. 4 is a schematic drawing illustrating a second mask in the method for forming the patterned structure according to the first embodiment of the present invention.
Figure 5:
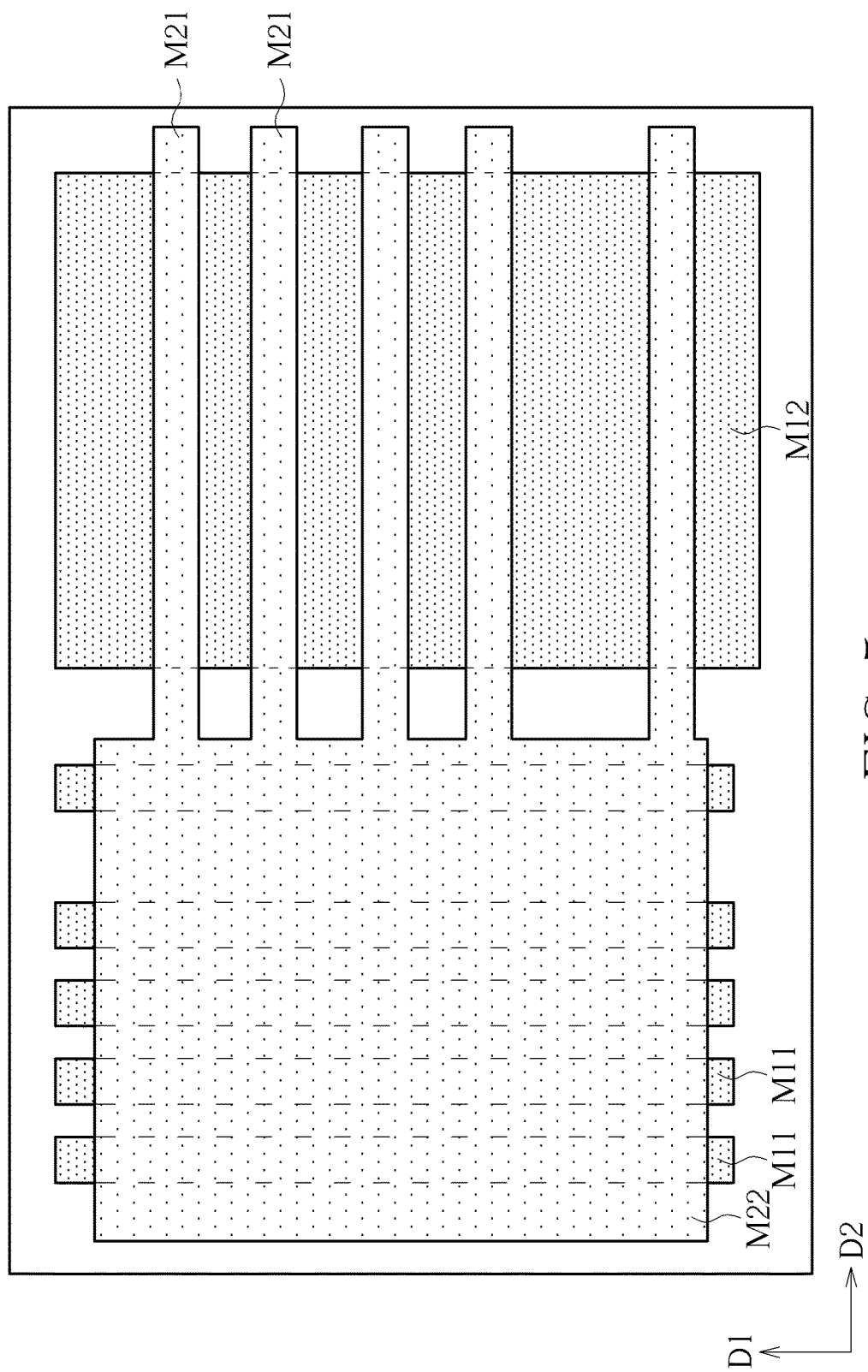
FIG. 5 is a schematic drawing illustrating an overlapping relation between the first mask and the second mask in the method for forming the patterned structure according to the first embodiment of the present invention.
Figure 6:
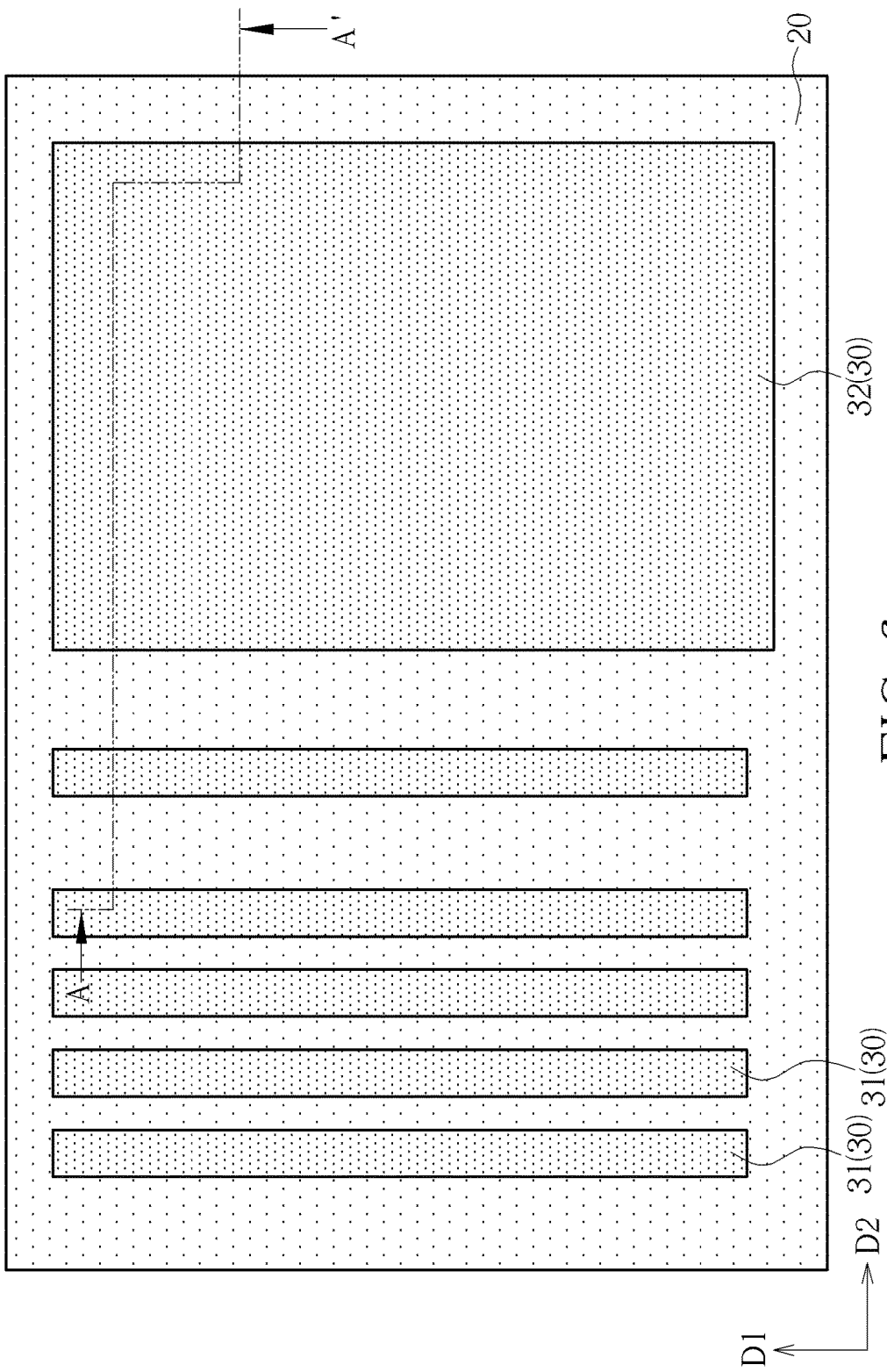
Figure 7:
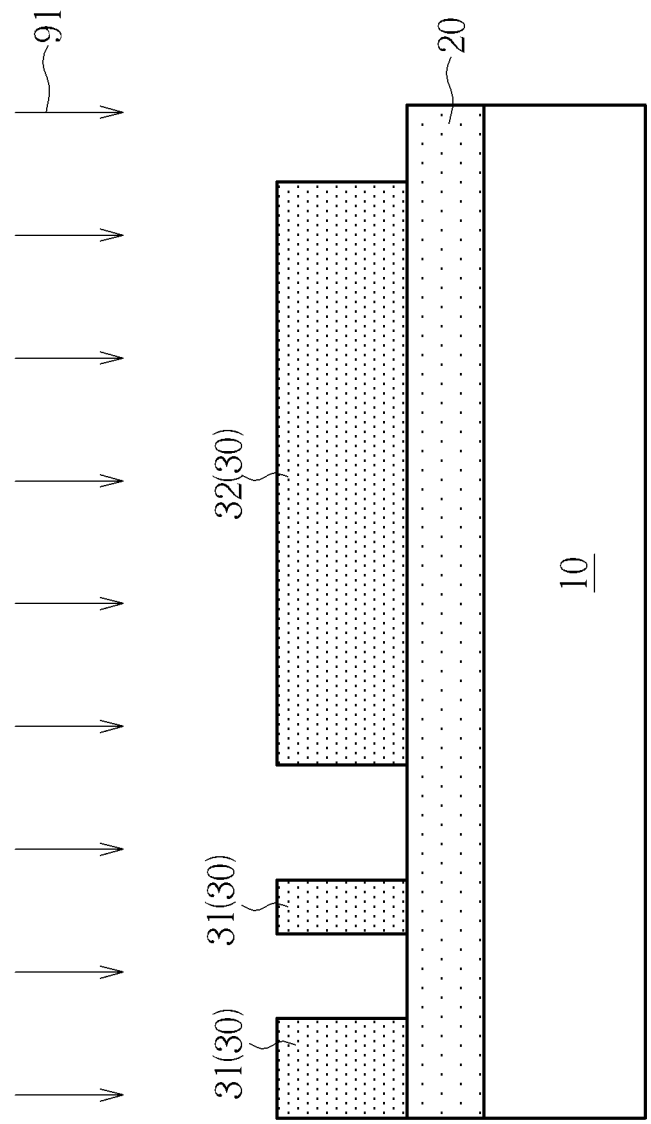

Please refer to FIGS. 1-12 FIG. 1 is a flow chart of a method for forming a patterned structure according to a first embodiment of the present invention. FIG. 2 is a schematic drawing illustrating a layout pattern in this embodiment. FIG. 3 is a schematic drawing illustrating a first mask in this embodiment. FIG. 4 is a schematic drawing illustrating a second mask in this embodiment. FIG. 5 is a schematic drawing illustrating an overlapping relation between the first mask and the second mask in this embodiment. FIGS. 6-12 are schematic drawings illustrating the method for forming the patterned structure in this embodiment. The method for forming the patterned structure in this embodiment includes the following steps. As shown in FIGS. 1-5, in step S1, a layout pattern 100 is provided. The layout pattern 100 includes a plurality of first lines 110 and a plurality of second lines 120. Each of the first lines 110 is elongated in a first direction D1, and each of the second lines 120 is elongate in a second direction D2. The first direction D1 is different from the second direction D2. For example, the first direction D1 may be orthogonal to the second direction D2, but not limited thereto. Additionally, the first lines 110 and the second lines 120 may be patterns of different portions of one patterned material layer, which is going to be formed, and the first lines 110 and the second lines 120 are separated from one another.

Subsequently, in step S2, the layout pattern 100 is decomposed for forming a first mask M1 and a second mask M2. As shown in FIG. 2 and FIG. 3, the first mask M1 includes a plurality of first line patterns M11 corresponding to the first lines 110 and a first block pattern M12 corresponding to the second lines 120. Specifically, each of the first line patterns M11 is formed based on one of the first lines 110, and the first block pattern M12 is formed based on an area covering all of the second lines 120. Therefore, each of the first line patterns M11 is elongated in the first direction D1, and a length L12 of the first block pattern M12 in the first direction D1 may be larger than the sum of the widths of the second lines 120, but not limited thereto. As shown in FIG. 2 and FIG. 4, the second mask M2 includes a plurality of second line patterns M21 corresponding to the second lines 120 and a second block pattern M22 corresponding to the first lines 110. Specifically, each of the second line patterns M21 is formed based on one of the second lines 120, and the second block pattern M22 is formed based on an area covering all of the first lines 110. Therefore, each of the second line patterns M21 is elongated in the second direction D2, and a length L22 of the second block pattern M22 in the second direction D2 may be larger than the sum of the widths of the first lines 110, but not limited thereto. In some embodiments, the second line patterns M21 may be connected with the second block pattern M22, but not limited thereto.

As shown in FIGS. 2-5, the first block pattern M12 overlaps a part of each of the second line patterns M21, and the second block pattern M22 overlaps a part of each of the first line patterns M11. The region where the first line patterns M11 and the second block pattern M22 overlap with one another is used to for a structure corresponding to the first lines 110, and the region where the second line patterns M21 and the first block pattern M12 overlap with one another is used to for a structure corresponding to the second lines 120. Accordingly, each of the first line patterns M11 of the first mask M1 is longer than each of the first lines 110 of the layout pattern 100 preferably, and each of the second line patterns M21 of the second mask M2 is longer than each of the second lines 120 of the layout pattern 100 preferably, but not limited thereto.

As shown in FIGS. 1-3 and FIGS. 6-9, in step S3, a first photolithography process with the first mask M1 is performed. The first photolithography process includes the following steps. A first patterned mask layer 30 is formed on a material layer 20. In some embodiments, the material layer 20 may be formed on a substrate 10, and the material layer 20 may include insulation materials, semiconductor materials, or conductive materials, but not limited thereto. The substrate 10 may include a semiconductor substrate, a glass substrate, a plastic substrate, or a substrate made of other materials. In some embodiments, the material layer 20 may also be a part of the substrate. The first patterned mask layer 30 may be a patterned photoresist layer or a patterned hard mask layer defined by the first mask M1. For example, the first patterned mask layer 30 may be a patterned photoresist layer formed by an exposure process utilizing the first mask M1 or a patterned hard mask layer formed by an etching process with the patterned photoresist layer as a mask. Therefore, the first patterned mask layer 30 may include a plurality of first parts 31 and a second part 32. The first parts 31 are defined by the first line patterns M11 of the first mask M1, and the second part 32 is defined by the first block pattern M12 of the first mask M1.

Figure 8:
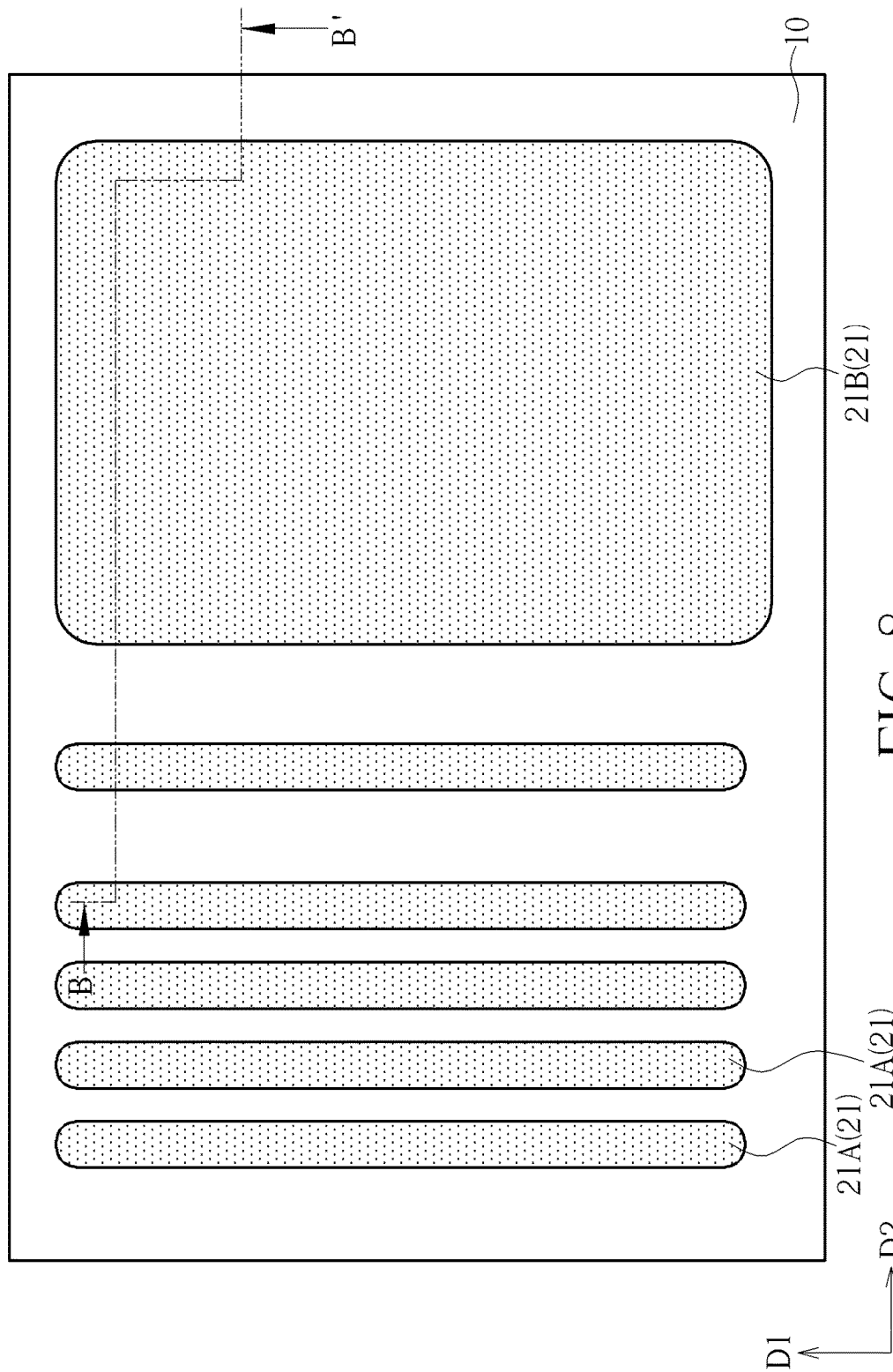
Figure 9:
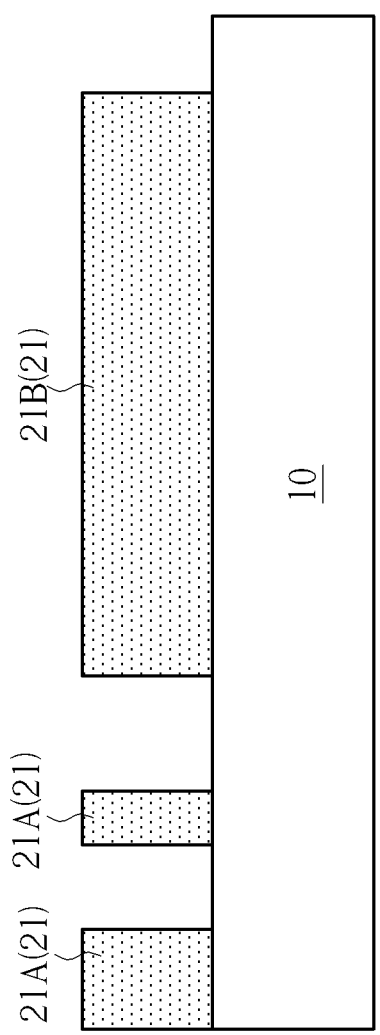
Figure 10:
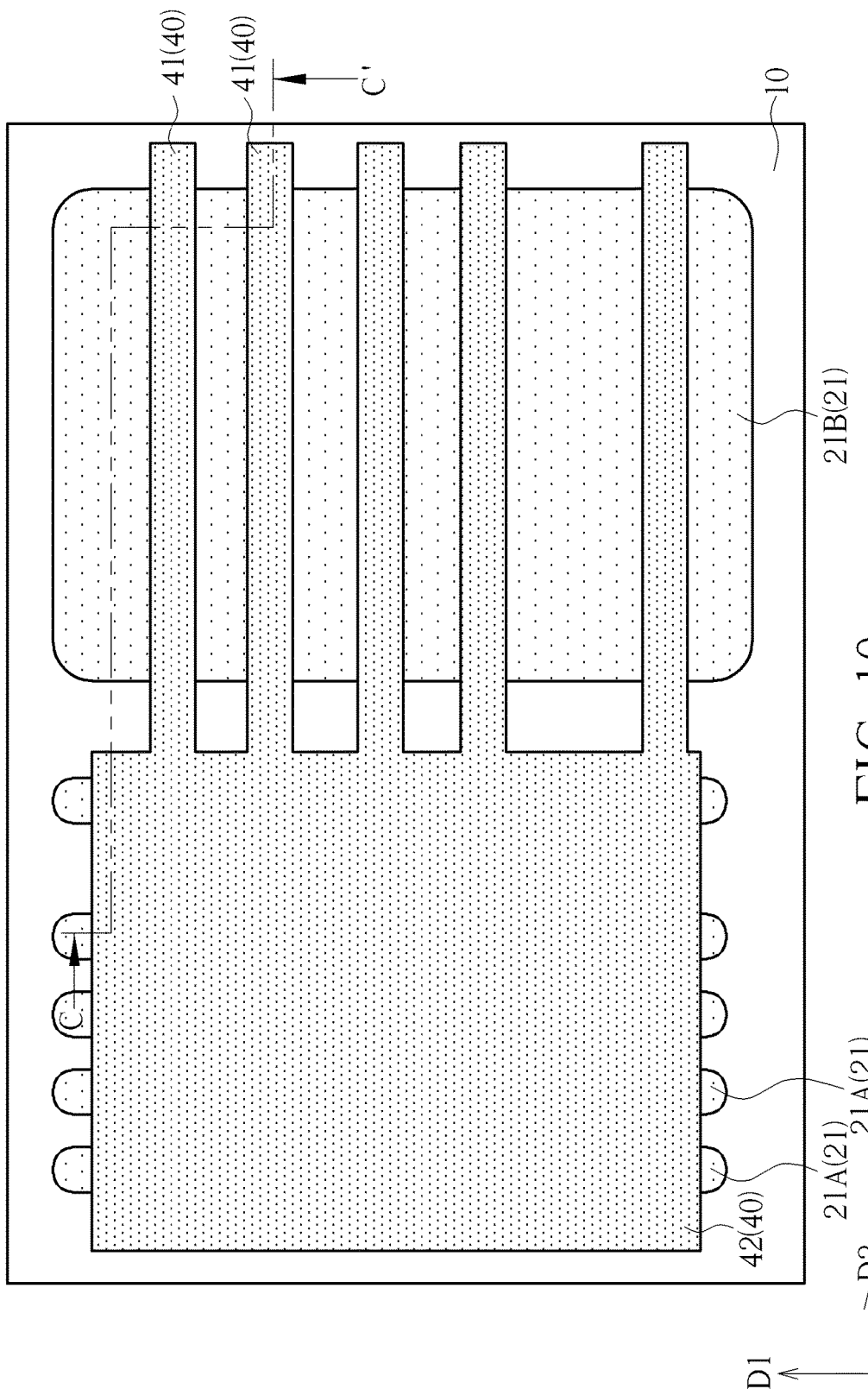
Figure 11:
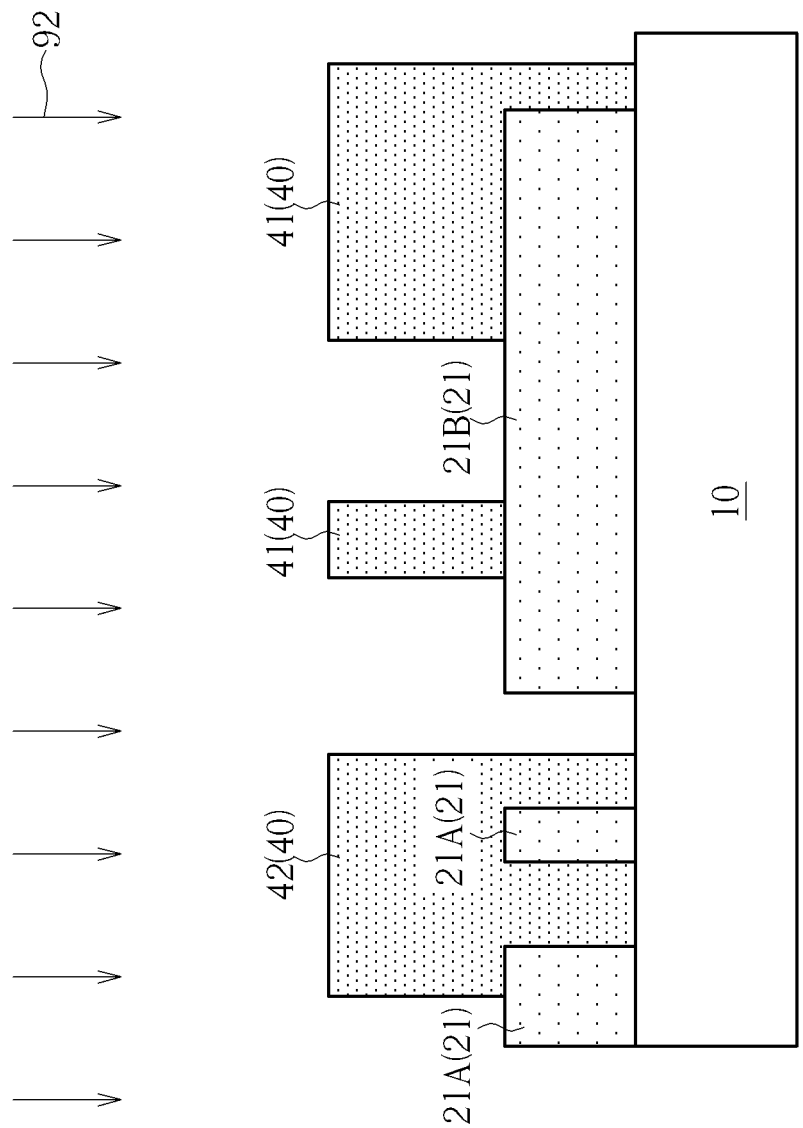

Subsequently, a first etching process 91 with the first patterned mask layer 30 as a mask is performed to remove a part of the material layer 20 which is not covered by the first patterned mask layer 30 for forming a first patterned material layer 21. The first patterned material layer 21 may include a plurality of first linear parts 21A and a first block part 21B. Each of the first linear parts 21A is elongated in the first direction D1 and formed corresponding to the first parts 31 of the first patterned mask layer 30. The first block part 21B is formed corresponding to the second part 32 of the first patterned mask layer 30. In other words, the pattern of the first mask M1 is transferred to the material layer 20 via the first patterned mask layer 30. As shown in FIG. 8, two opposite ends of each of the first linear parts 21A and the corners of the first block part 21B might be rounded because of properties of the photolithography process, and it is hard to align the ends of the first linear parts 21A because of the process variations between different first linear parts 21A.

As shown in FIG. 1, FIG. 2, FIG. 4, and FIGS. 9-11, in step S4, a second photolithography process with the second mask M2 is then performed. The first patterned mask layer described above is removed before the second photolithography process. The second photolithography process includes the following steps. A second patterned mask layer 40 is formed on the first patterned material layer 21 and the substrate 10. The second patterned mask layer 40 may be a patterned photoresist layer or a patterned hard mask layer defined by the second mask M2. For example, the second patterned mask layer 40 may be a patterned photoresist layer formed by an exposure process utilizing the second mask M2 or a patterned hard mask layer formed by an etching process with the patterned photoresist layer as a mask. Therefore, the second patterned mask layer 40 may include a plurality of third parts 41 and a fourth part 42. The third parts 41 are defined by the second line patterns M21 of the second mask M2, and the fourth part 32 is defined by the second block pattern M22 of the second mask M2. At least a part of each of the third parts 41 is formed on the first block part 21B of the first patterned material layer 21. The fourth part 42 covers a part of each of the first linear parts 21A of the first patterned material layer 21. Additionally, at least one end of each of the first linear parts 21A is not covered by the second patterned mask layer 40, and at least one end of each of the third parts 41 of the second patterned mask layer 40 is not formed on the first block part 21B of the first patterned material layer 21. For example, two opposite ends of each of the first linear parts 21A in the first direction D1 may be not covered by the second patterned mask layer 40, and two opposite ends of each of the third parts 41 in the second direction D2 may be not formed on the first block part 21B of the first patterned material layer 21.

Figure 12:
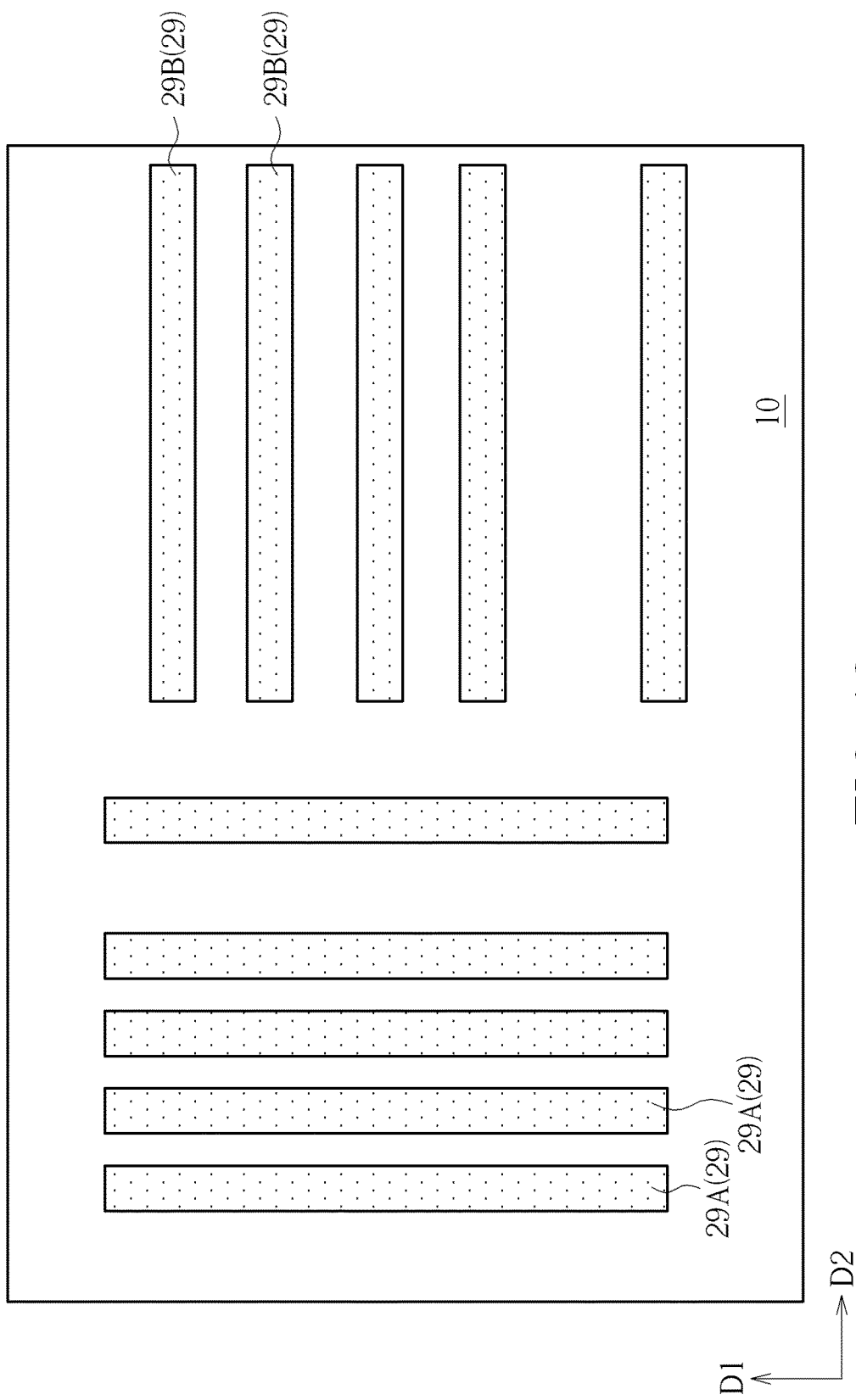

Subsequently, a second etching process 92 with the second patterned mask layer 40 as a mask is performed to remove a part of the first patterned material layer 21 which is not covered by the second patterned mask layer 40 for forming a patterned structure 29. The patterned structure 29 includes a plurality of first line structures 29A and a plurality of second line structures 29B. Each of the first line structures 29A is elongated in the first direction D1, and each of the second line structure 29B is elongated in the second direction D2. As shown in FIG. 5 and FIG. 12, the first line structures 29A are defined by a region where the first line patterns M11 and the second block pattern M22 overlap with one another, and the second line structures 29B are defined by a region where the second line patterns M21 and the first block pattern M12 overlap with one another. The corners of the first line structures 29A and the second line structures 29B may be substantially a right angle by the manufacturing method described above, and similarity between the patterned structure 29 and the layout pattern may be improved accordingly. Additionally, in the patterned structure 29, one end of each of the first line structures 29A may be aligned with ends of other first line structures 29A in the second direction D2, and one end of each of the second line structures 29B may be aligned with ends of other second line structures 29B in the first direction D1. The process window of the subsequent process may be improved, and it also benefits the integrity of the integrated circuit.

Figure 13:
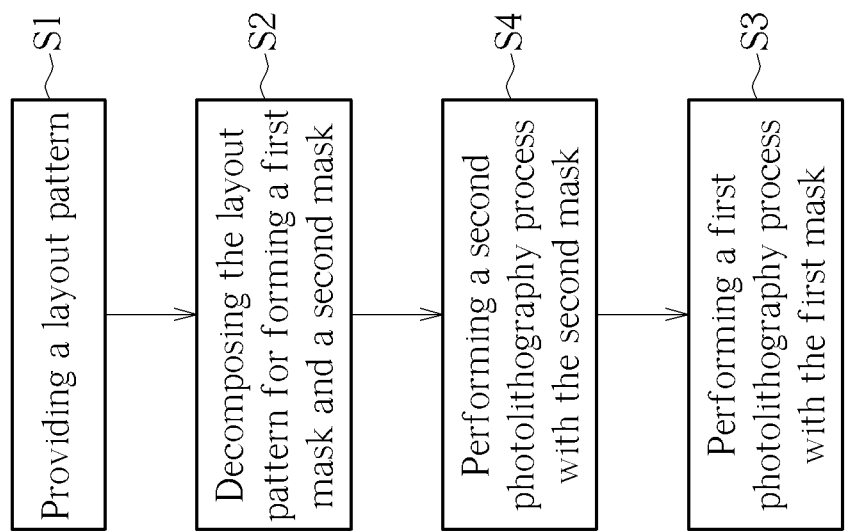
FIG. 13 is a flow chart of a method for forming a patterned structure according to a second embodiment of the present invention.
Figure 14:
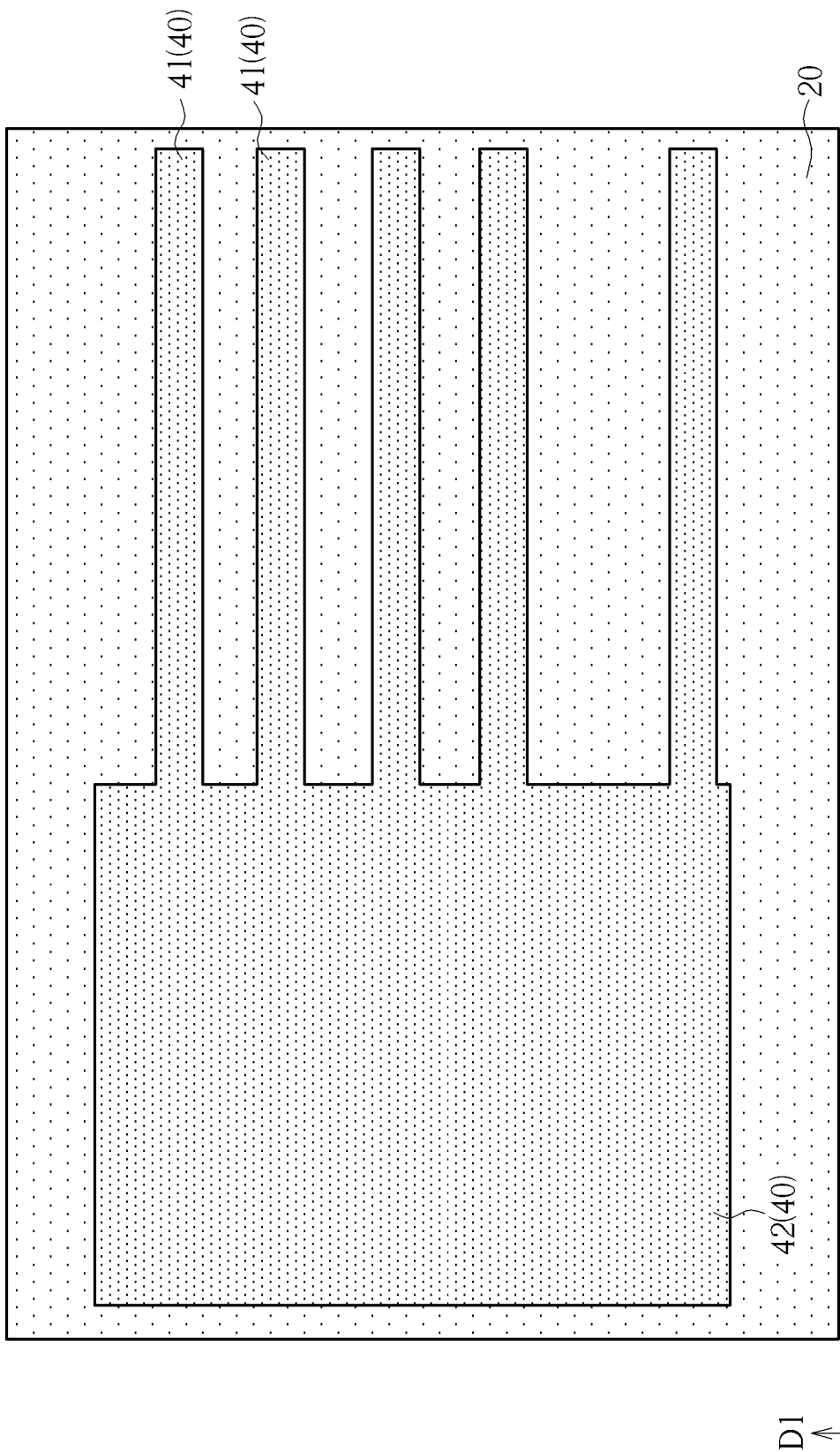
Figure 15:
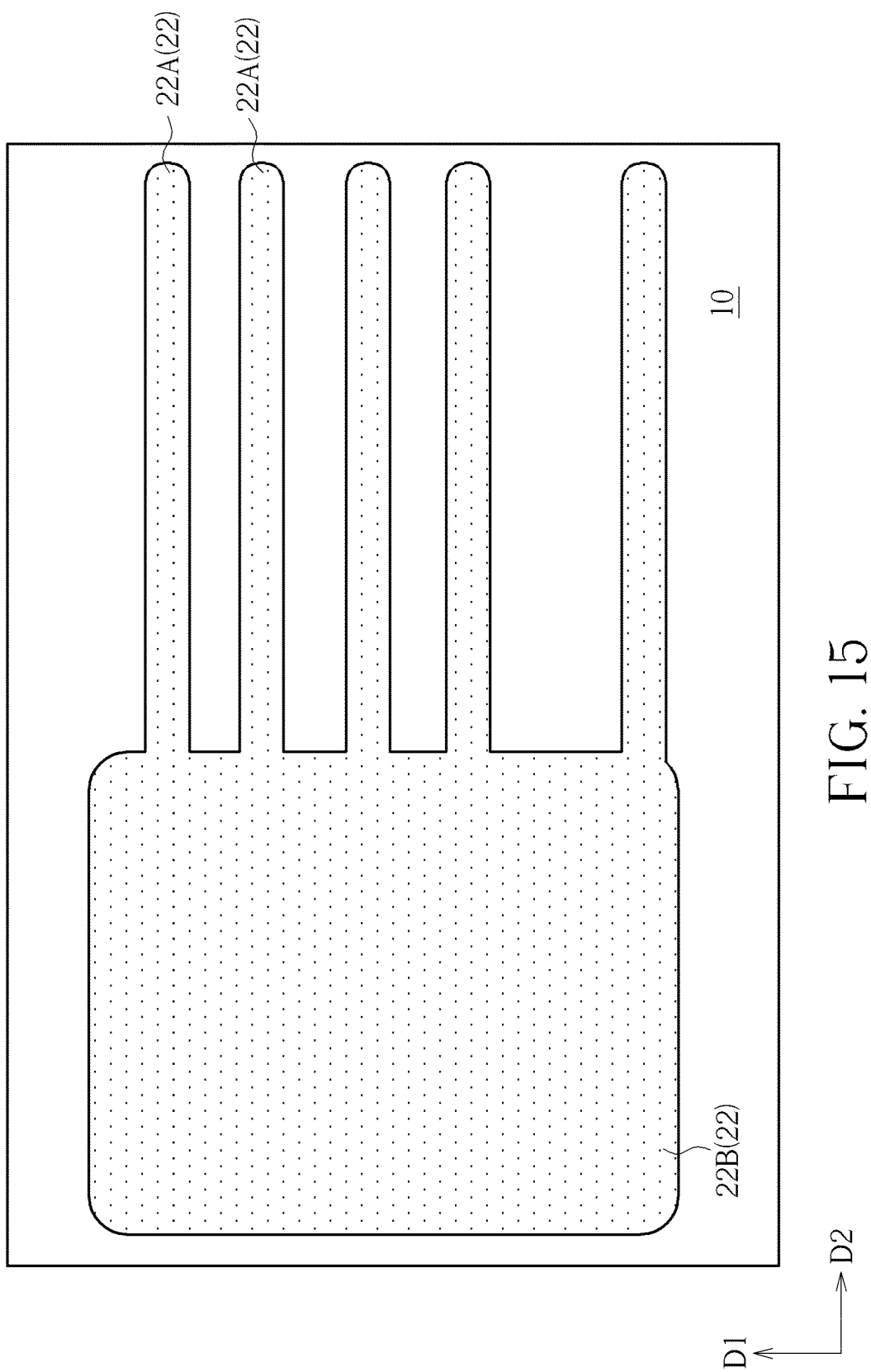
Figure 16:
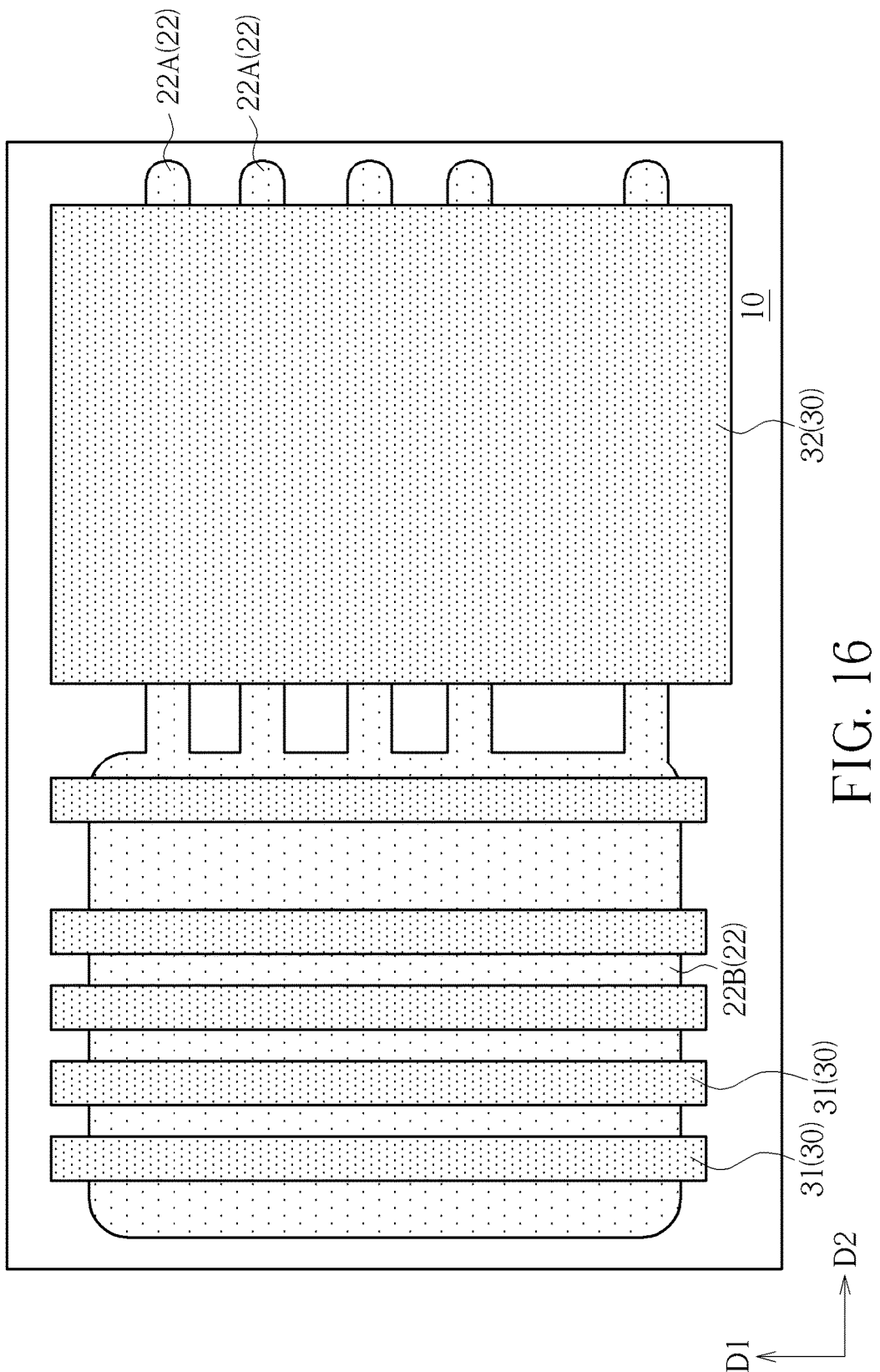

Please refer to FIG. 12 and FIGS. 13-16. FIG. 13 is a flowchart of a method for forming a patterned structure according to a second embodiment of the present invention. FIGS. 14-16 are schematic drawings illustrating the method for forming the patterned structure in this embodiment. As shown in FIG. 13, the difference between the method in this embodiment and the method in the first embodiment is that the second photolithography process is performed before the first photolithography process. Accordingly, as shown in FIG. 14 and FIG. 15, the second patterned mask layer 40 is formed on the material layer 20, and an etching process with the second patterned mask layer 40 as a mask is performed to remove a part of the material layer 20 which is not covered by the second patterned mask layer 40 for forming a second patterned material layer 22. The second patterned material layer 22 may include a plurality of second linear parts 22A and a second block part 22B. Each of the second linear parts 22A is elongated in the first direction D1 and formed corresponding to the third parts 41 of the second patterned mask layer 40. The second block part 22B is formed corresponding to the fourth part 42 of the second patterned mask layer 40. In other words, the pattern of the second mask M2 is transferred to the material layer 20 via the second patterned mask layer 40. As shown in FIG. 16 and FIG. 12, the first patterned mask layer 30 is formed on the second patterned material layer 22 and the substrate 10. At least a part of each of the first parts 31 of the first patterned mask layer 30 is formed on the second block part 22B of the second patterned material layer 22. The second part 32 of the first patterned mask layer 30 covers a part of each of the second linear parts 22A of the second patterned material layer 22. Subsequently, an etching process with the first patterned mask layer 30 as a mask is performed to remove a part of the second patterned material layer 22 which is not covered by the first patterned mask layer 30 for forming the patterned structure 29 shown in FIG. 12.

To summarize the above descriptions, in the method for forming the patterned structure of the present invention, the first lines and the second lines elongated in different directions in the layout pattern are decomposed into two masks. The first line structures of the patterned structure are defined by the region where the first line patterns of the first mask and the second block pattern of the second mask overlap with one another, and the second line structures of the patterned structure are defined by the region where the second line patterns of the second mask and the first block pattern of the first mask overlap with one another. Accordingly, one end of each of the first line structures may be aligned with ends of other first line structures, and one end of each of the second line structures may be aligned with ends of other second line structures. The similarity between the patterned structure and the layout pattern and the related process window may be improved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a patterned structure, comprising:
    providing a layout pattern, wherein the layout pattern comprises:
        a plurality of first lines, wherein each of the first lines is elongated in a first direction; and
        a plurality of second lines, wherein each of the second lines is elongate in a second direction, wherein the first direction is orthogonal to the second direction;
    decomposing the layout pattern for forming:
        a first mask comprising:
            a plurality of first line patterns corresponding to the first lines; and
            a first block pattern corresponding to the second lines; and
        a second mask comprising:
            a plurality of second line patterns corresponding to the second lines; and
            a second block pattern corresponding to the first lines; and
    performing a first photolithography process with the first mask and a second photolithography process with the second mask for forming a patterned structure comprising:
        a plurality of first line structures, wherein each of the first line structures is elongated in the first direction, and the first line structures are defined by and structurally confined to a region where the first line patterns and the second block pattern overlap with one another; and
        a plurality of second line structures, wherein each of the second line structures is elongated in the second direction, and the second line structures are defined by and structurally confined to a region where the second line patterns and the first block pattern overlap with one another.

2. The method for forming the patterned structure according to claim 1, wherein one end of each of the first line structures is aligned with ends of other first line structures in the second direction.

3. The method for forming the patterned structure according to claim 1, wherein one end of each of the second line structures is aligned with ends of other second line structures in the first direction.

4. The method for forming the patterned structure according to claim 1, wherein each of the first line patterns of the first mask is longer than each of the first lines of the layout pattern.

5. The method for forming the patterned structure according to claim 1, wherein each of the second line patterns of the second mask is longer than each of the second lines of the layout pattern.

6. The method for forming the patterned structure according to claim 1, wherein the first photolithography process comprises:
   forming a first patterned mask layer on a material layer, wherein the first patterned mask layer comprises:
   a plurality of first parts defined by the first line patterns of the first mask; and
   a second part defined by the first block pattern of the first mask; and
   performing a first etching process with the first patterned mask layer as a mask to remove a part of the material layer which is not covered by the first patterned mask layer for forming a first patterned material layer, wherein the first patterned material layer comprises:
   a plurality of first linear parts, wherein each of the first linear parts is elongated in the first direction and formed corresponding to the first parts of the first patterned mask layer; and
   a first block part formed corresponding to the second part of the first patterned mask layer.

7. The method for forming the patterned structure according to claim 6, wherein the second photolithography process comprises:
   forming a second patterned mask layer on the first patterned material layer, wherein the second patterned mask layer comprises:
   a plurality of third parts defined by the second line patterns of the second mask, wherein at least a part of each of the third parts is formed on the first block part of the first patterned material layer; and
   a fourth part defined by the second block pattern of the second mask, wherein the fourth part covers a part of each of the first linear parts of the first patterned material layer; and
   performing a second etching process with the second patterned mask layer as a mask to remove a part of the first patterned material layer which is not covered by the second patterned mask layer for forming the patterned structure.

8. The method for forming the patterned structure according to claim 7, wherein at least one end of each of the first linear parts is not covered by the second patterned mask layer.

9. The method for forming the patterned structure according to claim 8, wherein two opposite ends of each of the first linear parts in the first direction are not covered by the second patterned mask layer.

10. The method for forming the patterned structure according to claim 7, wherein at least one end of each of the third parts of the second patterned mask layer is not formed on the first block part of the first patterned material layer.

11. The method for forming the patterned structure according to claim 10, wherein two opposite ends of each of the third parts in the second direction are not formed on the first block part of the first patterned material layer.

12. The method for forming the patterned structure according to claim 6, wherein the first patterned mask layer is removed before the second photolithography process.

13. The method for forming the patterned structure according to claim 1, wherein the first mask has active components for the first line patterns and the second mask has active components for the second line patterns, respectively.

* * * * *